DELAY LINE HAVING SIGNAL SAMPLER WHICH FEEDS SHIFT REGISTER AND SIGNAL SYNTHESIZER, INTEGRATOR USING SAME

Filed July 1, 1957

INVENTOR
JAMES J. PASTORIZA
BY
Curtis Morris & Safford
ATTORNEYS:

United States Patent Office 3,007,114

Patented Oct. 31, 1961

3,007,114
DELAY LINE HAVING SIGNAL SAMPLER WHICH FEEDS SHIFT REGISTER AND SIGNAL SYNTHESIZER, INTEGRATOR USING SAME

James J. Pastoriza, 14 Hillside Ave., Cambridge, Mass.

Filed July 1, 1957, Ser. No. 669,032
18 Claims. (Cl. 328—14)

Figures 1, 2:
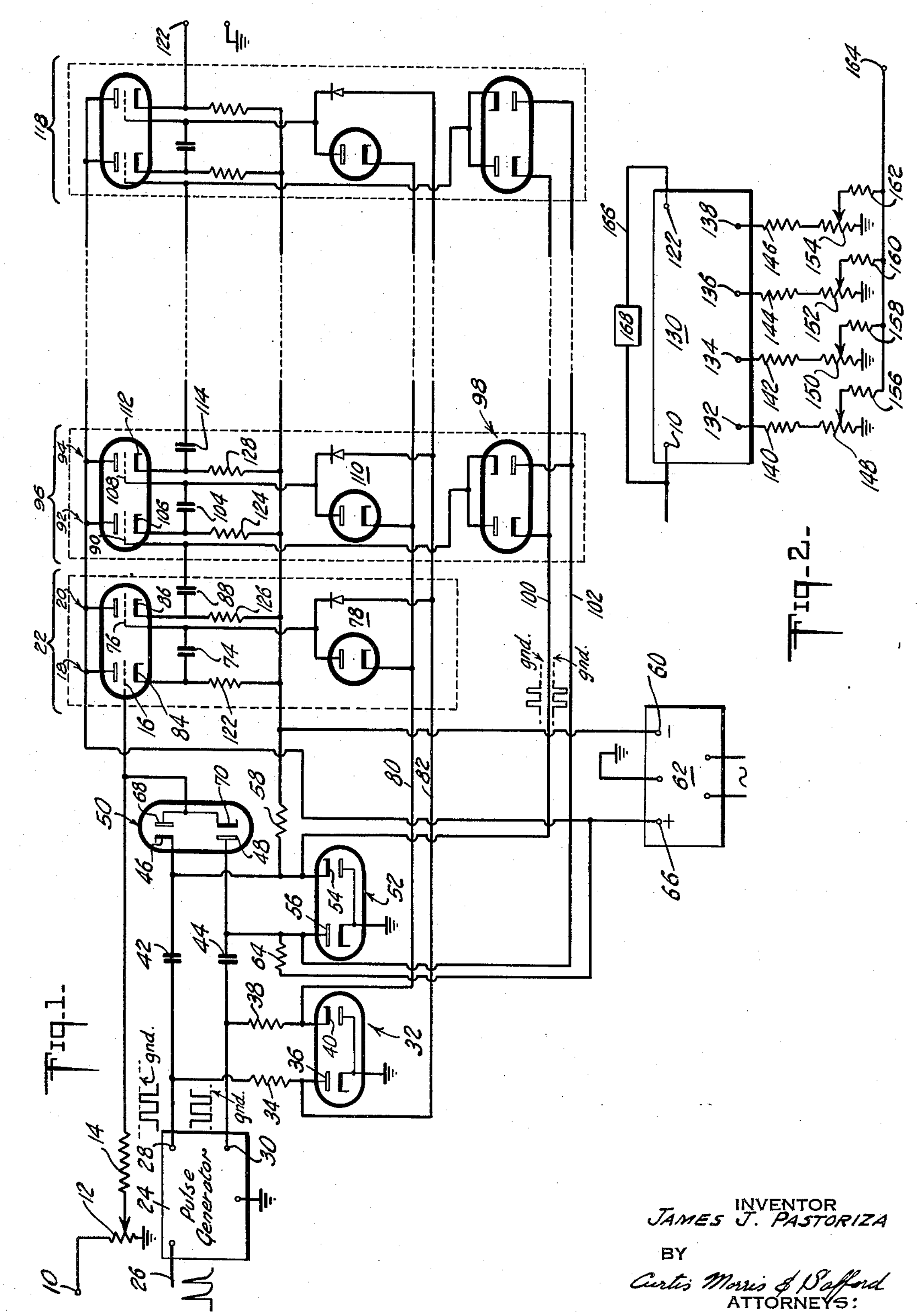

This invention relates to delay lines adapted to receive an electrical input signal and to produce a corresponding electrical output signal a predetermined time later. More particular, this invention relates to such delay lines having a relatively long time delay, and wherein the amount of delay is variable over a wide range.

Delay lines of various types have of course been in use for many years. Commonly, these delay lines have comprised a number of capacitors and inductors connected together to simulate a transmission line. Such delay lines, however, are not capable of providing relatively long time delays, e.g. up to one second or so. Furthermore, conventional delay lines used heretofore introduce errors and distortion effects, particularly when relatively large input signals are involved.

It is possible to obtain relatively long time delays by a delay line which comprises a series of capacitors interconnected by synchronized electronic switches. In such an arrangement, the input signal is sampled at a periodic rate to produce a train of sample signals to be applied to the first capacitor of the delay line. During the application of any one sample pulse, the first capacitor is isolated from the second capacitor, but after the pulse has subsided the first capacitor is switched to the second capacitor to charge up the second capacitor to a level corresponding to the signal amplitude during the previous pulse. During the next pulse, the charge on the second capacitor is switched to the third capacitor, the first capacitor being charged up to the level of a new sample from the input signal. Thus, any sample signal is transferred down the line of capacitors and eventually emerges as an output signal on the last capacitor. Consequently, the output signal will follow the input signal but will be delayed therefrom a duration determined by the number of capacitors and the sampling rate.

Constructing a practical and commercially successful delay line of this type, however, involves a number of problems. For example, the delay line must be arranged to assure that there is minimum error in signal as the sample is transferred between the capacitors. Conventional buffer amplifiers with electronic switching may be used between the storage capacitors, but it has been found that these introduce drift and other effects leading to inaccuracy and instability.

Accordingly, it is an object of this invention to provide a delay line that is superior to delay lines provided heretofore. It is a further object of this invention to provide a delay line of the type which includes a plurality of electrical storage elements interconnected with synchronized signal-transferring apparatus especially adapted to assure distortion-free transfer of signals between the storage elements. It is a still further object of this invention to provide such a delay line that is simple in construction and inexpensive to manufacture. Other objects, advantages and aspects of the present invention will be in part pointed out in, and in part apparent from, the following description of a preferred embodiment of the invention considered together with the accompanying drawing in which:

FIGURE 1 is a schematic circuit diagram of a delay line embodying this invention; and FIGURE 2 is a block diagram showing the delay line of FIGURE 1 arranged as a signal synthesizer.

Referring now to the upper left-hand corner of FIGURE 1, there is shown an input terminal 10 to which the signal to be delayed is applied. This terminal is connected through a potentiometer 12 and isolating resistor 14 to the control grid 16 of a triode tube 18 which with the next adjacent tube 20 comprises the first section 22 of a multisection delay line.

The signal applied to the input terminal 10 will ordinarily vary with time, e.g. as a sine wave or step-impulse, etc., and means are provided to sample this signal so as to produce a series of periodically-spaced sample pulses, to be fed to the control grid 16. For this purpose, there is provided a pulse generator 24 having an input terminal 26 and two output terminals 28 and 30. This pulse generator, which may be of any conventional design suited for the purpose, is arranged to produce at its upper output terminal 28 a train of positive-going pulses, and simultaneously at its lower output terminal 30 a train of negative-going pulses. During the time between the pulses (i.e. the "interpulse" time), the output terminal 28 is at a substantially negative potential (e.g. 80 volts) and the other output terminal is at a correspondingly substantial positive potential. The pulse-repetition-rate is controlled by keying impulses fed to the input terminal 26. In the embodiment described herein, the duration of each output pulse is one millisecond and the pulse period can be varied between 10 milliseconds and one second.

The pulses produced at the output terminals 28 and 30 are clamped to ground potential during the time of each pulse by means of a pair of reverse-connected diodes 32. To accomplish this, the upper output terminal 28 is connected through a small (1000 ohms) resistor 34 to the plate 36 of one of these diodes and the lower output terminal 30 is connected through a corresponding resistor 38 to the cathode 40 of the other diode. The other plate and cathode of the diodes are connected to ground. Accordingly, it will be apparent that the potential of the diode plate 36 can rise no higher than ground reference, and the potential of the diode cathode 40 can go no lower than ground reference.

The two trains of pulses are fed from the output terminals 28 and 30 through corresponding coupling capacitors 42 and 44 to the cathode 46 and plate 48, respectively, of a second pair of reverse-connected diodes 50. During the time between the pulses, the potential of these electrodes 46 and 48 is clamped to ground by another pair of reverse-connected and grounded diodes 52. For this purpose, the cathode 46 is connected to the cathode 54 of one of the diodes 52 and the plate 48 is connected to the plate 56 of the other one of the diodes 52. Cathode 54 also is connected through a relatively large (470,000 ohms) resistor 58 to the negative terminal 60 (300 volts to ground) of a D.-C. power supply 62, while plate 56 is connected through a corresponding large resistor 64 to the positive terminal 66 (300 volts to ground) of this power supply.

The remaining plate and cathode 68 and 70 of the diodes 50 are connected together to the control grid 16 of the tube 18. Because of the ground-clamping action provided by the diodes 50 and 52, the potential of this control grid will be maintained at ground during the time between the pulses produced by the generator 24. However, when a positive pulse is applied to the cathode 46 and at the same time a negative pulse is applied to the plate 48, it will be apparent that the diodes 50 will effectively be disconnected from the control grid and, accordingly, the potential of this grid will be determined by the input signal applied to the input terminal 10. Therefore, the control grid is fed periodic samples of the input signal, the sample rate being equal to the pulse-repetition-rate of the pulse generator.

The amplifier tube 18 is connected as a cathode-follower and its cathode 72 is coupled through a storage capacitor 74 to the control grid 76 of the second tube 20 which also is connected as a cathode-follower. In order that the storage capacitor 74 be charged up an amount corresponding to the sample signal fed to the grid 16, the control grid 76 of the second tube is clamped to ground during the time of the sample pulses. This is accomplished by a pair of reverse-connected diodes 78 the right-hand one of which is preferably a silicon rectifier in order to assure minimum leakage. These diodes are connected respectively to a pair of leads 80 and 82 which in turn are connected to the plate 40 and cathode 36 of the diodes 32. As explained above, these latter electrodes are clamped to ground potential during the time of the pulses, and accordingly the control grid 76 also is clamped to ground during the pulse time. During the time between the pulses, the cathode of the left-hand diode 78 will be driven positive, and the plate of the right-hand diode will be driven negative, so that these two units are effectively disconnected from the control grid 76 which therefore is free to shift to a potential determined by the charge placed upon the storage capacitor 74.

To summarize the operation of the delay section 22, during the time of the pulses the control grid 76 of the second tube 20 is maintained at ground potential and the first tube 18 therefore will charge up the storage capacitor 74 to a voltage substantially equal to the magnitude of the input signal on the grid 16 at that time. Immediately after the pulse, the control grid 16 and cathode 84 of the first tube will be clamped to ground potential, while the grid 76 of the second tube is unclamped from ground. Therefore, the control grid 76 will be brought to the potential built up across the storage capacitor 74 during the preceding pulse. Substantially this same potential change will appear at the cathode 86 of the second tube 20 by virtue of the cathode-follower's unity gain.

The cathode 86 is coupled through a second storage capacitor 88 to the control grid 90 of a tube 92 which, with the next adjacent tube 94, comprises another section 96 of the delay line identical to the first section 22. During the time between pulses, the grid 90 is clamped to ground by a pair of reverse-connected diodes 98 which are connected by a pair of leads 100 and 102 to the grounded diodes 52, the diodes 98 functioning in the same manner as the diodes 50 previously described. With the grid 90 held at ground potential, the capacitor 88 will charge up to the potential of the cathode 86 during the inter-pulse time. It will be apparent that the charge placed on this capacitor during the inter-pulse time will correspond to the magnitude of the input signal fed to the control grid 16 of the tube 18 during the immediately preceding pulse.

When the next succeeding pulse occurs, the control grid 76 of the tube 20 is clamped to ground, as previously described, and the potential of the cathode 86 accordingly is returned to ground. At the same time, the control grid 90 of the tube 92 is unclamped from ground and, accordingly, its potential is shifted to a level corresponding to the charge previously built up on the storage capacitor 88 during the preceding inter-pulse time. The control grid 90 is unclamped from ground during the time of the pulses because the diodes 98 are effectively disconnected from the circuit by the positive and negative pulses which are applied, respectively, to the lower plate and cathode of these diodes.

With the control grid 90 at the new potential produced by the charge on the capacitor 88, the tube 92 charges up a third storage capacitor 104 connected to the tube cathode 106 in the same manner that the storage capacitor 74 is charged up by the tube 18. The other plate of the capacitor 104 is connected to the control grid 108 of the next tube 94, and this latter grid is clamped to ground during the pulses by means of a pair of reverse-connected diodes 110 which function as the diodes 78. Consequently, during this next pulse the capacitor 104 is charged up to the potential of the capacitor 88.

After this next pulse subsides, the control grid 90 again is clamped to ground and the control grid 108 is unclamped from ground, so that the potential of the control grid 108 is shifted to a level corresponding to the charge previously built up on the capacitor 104. This potential is applied by the cathode 112 of the tube 94 to another storage capacitor 114 connected thereto and which is charged up in the same manner as the capacitor 88 previously described.

Reviewing the overall operation of the delay line thus far described, during any given pulse a sample of the input signal is applied to the grid 16 of the tube 18 which thereupon charges up the capacitor 74 to the potential of the sample. During the following inter-pulse time, the second capacitor 88 is charged up to this same potential. When the next pulse arrives, the third capacitor 104 is charged up to the potential of the second capacitor 88, while the first capacitor 74 is charged up to the potential of the new sample from the input signal. During the next following inter-pulse time, the fourth capacitor 114 is charged up to the potential of the third capacitor 104, while the second capacitor 88 is charged up to the potential of the first capacitor 74.

Thus, it will be apparent that each sample of the input signal is transferred down the delay line at a speed determined by the pulse-repetition-rate of the generator 24. During each complete cycle of the generator output, the sample is shifted in a "two-step" operation from the first section 22 to the next section 96. Any desired number of similar delay sections may be employed as indicated by a third section 118 shown on the drawing (e.g. five sections were used in a delay line built and successfully tested), and from the final section 118 the delayed signal samples are fed to an output terminal 120. Conventional output filtering may be used to smooth the delayed pulse samples and produce an output signal substantially identical to the original input signal.

One advantage of the arrangement described is that the second capacitor of each delay section (i.e. capacitors 88 and 114) is coupled to the next succeeding tube input only a minor fraction (one-tenth or less) of the time, and hence these capacitors can be relatively small without encountering important errors due to leakage. For example, capacitors 88 and 114 in the embodiment disclosed herein each had a capacitance of .001 microfarad, while capacitors 94 and 104 had a capacitance of .01 microfarad. To assure adequate charging current, the cathode resistors 122 and 124 of tubes 18 and 92 are 47,000 ohms, while the cathode resistors 126 and 128 of tubes 20 and 94 can be much larger, e.g. 470,000 ohms in this embodiment. Also, lower quality clamping diode pairs (50, 98, etc.) can be used for clamping the input of each section. Thus, because the signals stored in the capacitors 88 and 114 are sampled only for a short period of time each cycle, the problems of maintaining the signals on these capacitors is substantially reduced.

In addition, this arrangement avoids errors due to drift because the output cathodes of each section are returned to the fixed ground potential during each pulse, so that the D.-C. level is periodically restored throughout the delay line. It should also be noted that the sample signal is inverted at each cathode-follower stage, thereby substantially eliminating second-harmonic distortion.

The delay line shown in FIGURE 1 can also be used as a synthesizer of transient wave-forms or to simulate a complex function. Such an arrangement is shown diagrammatically in FIGURE 2, where the delay line generally indicated at 130 (identical to the FIGURE 1 showing) is provided with a number of auxiliary output terminals 132, 134, 136, 138 each connected within the delay line to the respective cathodes (106, etc.) of the first stage of each delay section not including the first section. These auxiliary terminals are connected through corresponding isolation resistors 140, 142, 144, 146, signal-varying potentiometers 148, 150, 152, 154, and further isolation resistors 156, 158, 160, 162 to a common synthesis output terminal 164.

Thus, the outputs of the individual delay sections are added together with any desired gain factor in accordance with the settings of the various potentiometers 148 through 154. By applying a step-impulse or unit impulse signal, for example, to the input terminal 10 the delay-line synthesizer can be set to provide a combined output on the terminal 164 which simulates the action of a wide variety of networks or complex devices. It may particularly be noted that the individual signals at the auxiliary output terminals can be added together (or multiplied) without regard to the D.-C. level, since the ground reference is periodically restored at each section. Thus, the synthesizer is a useful tool in analytical or design problems and the like.

Furthermore, it has been found desirable in some applications to provide a feedback circuit 166 to feed the delay line output from terminal 122 back to the input terminal 10. This has the effect of lengthening the delay line without adding any more sections. If desired, the feedback circuit may include a compensating impedance or buffer as generally indicated at 168, e.g. to either decrease or increase the level of the signal fed back, or to invert its polarity.

For certain specific applications, the delay line 130 advantageously consists of a single delay section such as section 22 of FIGURE 1. The auxiliary output terminals 132 through 138 are omitted, and the output terminal 122 is connected directly to the capacitor 88 in place of the control grid 90 of the tube 92, the clamping diodes 98 being retained to clamp the output terminal to ground during the inter-pulse time. This arrangement provides a simple and flexible unit adapted, for example, to serve as an integrator. That is, with the feedback connection 166 arranged to provide positive feedback (i.e. to augment the input signal), the output signal on the terminal 122 will represent the integral of the input signal on the terminal 10. A special feature of such an arrangement is that the rate of integration can be varied merely by changing the pulse-repetition frequency, e.g. in accordance with a predetermined function.

Although several preferred embodiments of the present invention have been set forth in detail, it is desired to emphasize that these are not intended to be exhaustive or necessarily limitative; on the contrary, the showings herein are for the purpose of illustrating the invention and thus to enable others skilled in the art to adapt the invention in such ways as meet the requirements of particular applications, it being understood that various modifications may be made without departing from the scope of the invention as limited by the prior art.

I claim:

1. Apparatus for producing time delay in the transmission of an electrical signal comprising, in combination, an input terminal adapted to receive said electrical signal, current control means coupled to said input terminal and adapted to produce an output voltage in accordance with the magnitude of said signal, an electrical-energy storage device having first and second terminals through which current flows in accordance with the voltage applied thereto, said first terminal being connected to the output of said current control means and said second terminal comprising an output terminal for said apparatus, a pulse generator for producing a train of pulses, first clamping means under the control of said generator and arranged to maintain said output terminal at a predetermined reference potential during the time of said pulses so that said storage device receives an amount of energy corresponding to said signal at that time, second clamping means under the control of said pulse generator and arranged to shift the potential of said first storage device terminal to a predetermined reference potential during the inter-pulse time, and circuit means for disabling said first clamping means during the inter-pulse time whereby the stored energy in said device is applied to said output terminal as a delayed representation of said electrical signal during the preceding pulse.

2. Apparatus as claimed in claim 1, wherein said current control means comprises an electrical amplifier.

3. Apparatus as claimed in claim 2, wherein said amplifier is of the cathode-follower type, and said storage device comprises a capacitor.

4. Apparatus as claimed in claim 2, wherein said clamping means includes at least one non-linear circuit element coupled to the output of said generator.

5. Apparatus as claimed in claim 4, wherein said clamping means includes a pair of reverse-connected diode elements.

6. For use in a delay line, apparatus comprising an amplifier having an input and an output terminal, an output connection for said apparatus, a capacitor connected between said amplifier output terminal and said output connection, a pulse generator adapted to produce a train of time-spaced electrical pulses for controlling the operation of said amplifier, signal transmission means under the control of said generator for feeding sample signals to said amplifier input terminal during said pulses, first clamping means under the control of said generator for maintaining said output connection at a predetermined reference potential during said pulses, said capacitor thereby being charged up during said pulses an amount corresponding to the magnitude of each sample signal fed to said amplifier, second clamping means for shifting said amplifier output terminal to a predetermined reference potential during the time between the individual pulses produced by said generator, and circuit means for deactivating said first clamping means during the time between said pulses so that the potential of said output connection is determined by the charge placed on said capacitor during the preceding pulse, whereby to produce at said output connection a delayed output signal corresponding to the magnitude of the sample signal fed to said amplifier input terminal during the preceding pulse.

7. Apparatus as claimed in claim 6, wherein said amplifier is of the cathode-follower type.

8. Apparatus as claimed in claim 6, wherein said generator is arranged to produce first and second trains of simultaneous positive-going and negative-going pulses respectively, said clamping means comprising a pair of reverse-connected diodes with one of said diodes activated by said positive-going pulses and the other diode activated by said negative-going pulses.

9. For use in a delay line, apparatus comprising first and second amplifiers each having an input and an output terminal, a capacitor connected between said first amplifier output terminal and said second amplifier input terminal, a pulse generator adapted to produce a train of time-spaced electrical pulses for controlling the operation of said amplifier, signal transmission means under the control of said generator for feeding sample signals to said first amplifier input terminal during said pulses, first clamping means under the control of said generator for maintaining said second amplifier input terminal at a predetermined reference potential during said pulses, said capacitor thereby being charged up during said pulses an amount corresponding to the magnitude of each sample signal fed to said first amplifier, second clamping means for shifting said first amplifier output terminal to a predetermined reference potential during the time between the individual pulses produced by said generator, and circuit means for de-activating said first clamping means during the time between said pulses so that the potential of said second amplifier input terminal is determined by the charge placed on said capacitor during the preceding pulse, whereby to produce at said second amplifier output terminal a delayed output signal corresponding to the magnitude of the sample signal fed to said first amplifier input terminal during the preceding pulse.

10. Apparatus as claimed in claim 9, wherein both said first and second amplifiers are cathode-followers.

11. Delay line apparatus comprising first and second amplifiers each having an input and an output terminal, an output connection for said apparatus, a first capacitor connected between said first amplifier output terminal and said second amplifier input terminal, a second capacitor connected between said output connection and said second amplifier output terminal, a pulse generator adapted to produce a train of time-spaced electrical pulses for controlling the operation of said amplifiers, signal transmission means under the control of said generator for feeding sample signals to said first amplifier input terminal during said pulses, first clamping means under the control of said generator for maintaining said second amplifier input terminal at a fixed reference potential during said pulses, said first capacitor thereby being charged up during said pulses an amount corresponding to the magnitude of each sample signal fed to said first amplifier, second clamping means for shifting said first amplifier input terminal to a fixed reference potential during the time between the individual pulses produced by said generator, said first amplifier output terminal thereby being shifted to a corresponding reference potential during the inter-pulse time, first circuit means for de-activating said first clamping means during the time between said pulses so that the potential of said second amplifier input terminal is determined by the charge placed on said capacitor during the preceding pulse, third clamping means to maintain said output connection at a fixed reference potential during the time between said pulses, said second capacitor thereby being charged up in accordance with the potential applied to said second amplifier input terminal during the inter-pulse time, and second circuit means for de-activating said third clamping means during said pulses, whereby to produce at said output connection during any given pulse a delayed output signal corresponding to the sample signal fed to said first amplifier input terminal during the preceding pulse.

12. Apparatus as claimed in claim 11, wherein said second capacitor is constructed and arranged to have a capacitance that is smaller than the capacitance of said first capacitor.

13. Apparatus as claimed in claim 12, wherein said pulse generator is constructed and arranged to produce pulses the time duration of which is smaller than the time between said pulses.

14. Apparatus adapted to be used in signal-delaying equipment of the type including means to store an electrical signal the amplitude of which is subsequently sampled and transmitted to other parts of said equipment, comprising current control means having input and output terminals, said input terminal being adapted to receive an input signal which is to be stored and subsequently sampled, a signal read-out device having input and output terminals, a storage capacitor coupled between said control means output terminal and said read-out device input terminal, first clamping means for maintaining said read-out device input terminal at a predetermined reference potential during the time said input signal is applied to said current control means input terminal, said capacitor thereby being charged up to a potential corresponding to the magnitude of said input signal, second clamping means for shifting said current control means output terminal to a predetermined reference potential during a sampling time subsequent to the application of said input signal, circuit means for unclamping said read-out device input terminal during said sampling time, and operating means for controlling said clamping means and said circuit means, said operating means being arranged to provide a sampling time that is shorter in duration than the time said signal is applied to said current control means input terminal.

15. A delay-line synthesizer comprising signal-sampling means adapted to receive an input signal and to produce spaced sample pulses in accordance with the signal amplitude, a plurality of cascaded delay sections coupled to said sampling means, each of said sections including capacitive storage means interconnected with corresponding synchronized signal-transferring devices for shifting the sample signals between said sections, a plurality of auxiliary output terminals each coupled to the output of a corresponding one of said sections, circuit means for combining the individual outputs of said terminals, and feedback means coupling the output of the final one of said sections to the input of the first one of said sections, whereby to effectively lengthen the delay time provided by said sections.

16. Delay line apparatus comprising a plurality of cascaded delay sections, a pulse generator adapted to produce a train of time-spaced electrical pulses for controlling the operation of said sections, signal transmission means under the control of said generator for feeding sample signals to the input of the first one of said sectons, each of said sections including: first and second amplifiers each having an input and an output terminal, a capacitor connected between said first amplifier output terminal and said second amplifier input terminal, first clamping means under the control of said generator for maintaining said second amplifier input terminal at a predetermined reference potential during said pulses, said capacitor thereby being charged up during said pulses an amount corresponding to the magnitude of each sample signal fed to said first amplifier, second clamping means for shifting said first amplifier output terminal to a predetermined reference potential during the time between the individual pulses produced by said generator, and circuit means for de-activating said first clamping means during the time between said pulses so that the potential of said second amplifier input terminal is determined by the charge placed on said capacitor during the preceding pulse, whereby to produce at said second amplifier output terminal a delayed output signal corresponding to the magnitude of the sample signal fed to said first amplifier input terminal during the preceding pulse.

17. Delay line apparatus comprising a plurality of cascade-connected delay sections, a pulse generator adapted to produce a train of time-spaced electrical pulses for controlling the operation of said sections, signal transmission means under the control of said generator for feeding sample signals to the input of said first section during said pulses, each of said sections including: first and second amplifiers each having an input and an output terminal, an output connection for said apparatus, a first capacitor connected between said first amplifier output terminal and said second amplifier input terminal, a second capacitor connected between said output connection and said second amplifier output terminal, first clamping means under the control of said generator for maintaining said second amplifier input terminal at a fixed reference potential during said pulses, said first capacitor thereby being charged up during said pulses an amount corresponding to the magnitude of each sample signal fed to said first amplifier, second clamping means for shifting said first amplifier input terminal to a fixed reference potential during the time between the individual pulses produced by said generator, said first amplifier output terminal thereby being shifted to a corresponding reference potential during the interpulse time, first circuit means for de-activating said first clamping means during the time between said pulses so that the potential of said second amplifier input terminal is determined by the charge placed on said capacitor during the preceding pulse, third clamping means to maintain said output connection at a fixed reference potential during the time between said pulses, said second capacitor thereby being charged up in accordance with the potential applied to said second amplifier input terminal during the inter-pulse time, and second circuit means for de-activating said third clamping means during said pulses, whereby to produce at said output connection during any given pulse a delayed output signal corresponding to the sample signal fed to said first amplifier input terminal during the preceding pulse.

18. Integrating apparatus comprising signal sampling means adapted to receive a continuous input signal and to produce spaced sample pulses in accordance with the signal amplitude at the instant of said pulses, signal delaying means having an input circuit coupled to said signal sampling means; said delaying means including at least one electrical storage element, first signal shifting means operable to transfer said sample pulses sequentially to said storage element, second signal shifting means operable to transfer the stored sample pulses sequentially out of said storage element after a predetermined storage time; and output circuit coupled to said signal delaying means and adapted to receive the sample pulses transferred out of said storage element by said second signal shifting means, pulse generator means for synchronously activating said signal sampling means and said first and second signal shifting means, and a positive feedback circuit coupling said output circuit to said input circuit so that a pulse transferred out of said storage element is fed back to said input circuit to augment a succeeding sample pulse being fed to said input circuit by said signal sampling means.

References Cited in the file of this patent

UNITED STATES PATENTS

| | | |
|---|---|---|
| 2,011,381 | Suits | Aug. 13, 1935 |
| 2,426,454 | Johnson | Aug. 26, 1947 |
| 2,543,874 | Shenk | Mar. 6, 1951 |
| 2,553,284 | Sunstein | May 15, 1951 |
| 2,618,745 | Eithel et al. | Nov. 18, 1952 |
| 2,750,499 | Newman et al. | June 12, 1956 |
| 2,792,496 | Rhodes | May 14, 1957 |
| 2,800,580 | Davies | July 23, 1957 |
| 2,830,179 | Stenning | Apr. 8, 1958 |